United States Patent
Brothers, III

(10) Patent No.: US 12,040,821 B2
(45) Date of Patent: Jul. 16, 2024

(54) WEIGHT PROCESSING FOR A NEURAL NETWORK

(71) Applicant: Arm Limited, Cambridge (GB)

(72) Inventor: John Wakefield Brothers, III, Calistoga, CA (US)

(73) Assignee: Arm Limited, Cambridge (GB)

( * ) Notice: Subject to any disclaimer, the term of this patent is extended or adjusted under 35 U.S.C. 154(b) by 162 days.

(21) Appl. No.: 17/880,285

(22) Filed: Aug. 3, 2022

(65) Prior Publication Data
US 2024/0048152 A1    Feb. 8, 2024

(51) Int. Cl.
*H03M 7/30*    (2006.01)
*G06F 7/544*    (2006.01)

(52) U.S. Cl.
CPC ........ *H03M 7/3066* (2013.01); *G06F 7/5443* (2013.01); *H03M 7/6011* (2013.01)

(58) Field of Classification Search
CPC ..... H03M 7/30; H03M 7/3066; H03M 7/6011
See application file for complete search history.

(56) References Cited

U.S. PATENT DOCUMENTS

| | | | | |
|---|---|---|---|---|
| 5,857,178 A * | 1/1999 | Kimura | ................... | G06N 3/063 706/41 |
| 9,041,720 B2 * | 5/2015 | Sadowski | ............. | G06F 1/3275 345/531 |
| 10,430,949 B1 * | 10/2019 | Wang | ...................... | G06N 3/084 |
| 11,164,084 B1 * | 11/2021 | David | ...................... | G06N 3/082 |
| 2017/0344876 A1 * | 11/2017 | Brothers | ................ | G06N 3/082 |
| 2019/0050734 A1 * | 2/2019 | Li | .............................. | G06N 3/04 |
| 2019/0087713 A1 * | 3/2019 | Lamb | ..................... | G06N 3/045 |
| 2020/0104692 A1 * | 4/2020 | Hill | ........................ | G06F 7/5443 |
| 2020/0160181 A1 * | 5/2020 | Zlateski | .................. | G06N 3/08 |
| 2020/0349697 A1 * | 11/2020 | Gao | ........................ | G06T 1/0007 |
| 2021/0027151 A1 * | 1/2021 | Udupa | ..................... | G06N 3/04 |
| 2021/0240684 A1 * | 8/2021 | Xiao | .................... | G06F 16/1744 |
| 2021/0287085 A1 * | 9/2021 | Kim | ........................ | G06F 18/285 |

(Continued)

OTHER PUBLICATIONS

Liu Zhi-Gang et al, "S2TA: Exploiting Structured Sparsity for Energy-Efficient Mobile CNN Acceleration", Apr. 2-6, 2022, IEEE InternationalSymposium on High-Performance Computer Architecture (HPCA).

(Continued)

*Primary Examiner* — Lam T Mai
(74) *Attorney, Agent, or Firm* — EIP US LLP

(57) ABSTRACT

Systems and methods for processing data for a neural network are described. The system comprises non-transitory memory configured to receive data bits defining a kernel of weights, the data bits being suitable for processing input data; and a data processing unit, configured to: receive bits defining a kernel of weights for the neural network, the kernel of weights comprising one or more non-zero value weights and one or more zero-valued weights; generate a set of mask bits, a position of each bit in the set of mask bits corresponds to a position within the kernel of weights and the value of each bit indicates whether a weight in the corresponding position is a zero-valued weight or a non-zero value weight; and transmit the non-zero value weights and the set of mask bits for storage, the non-zero value weights and the set of mask bits represent the kernel of weights.

20 Claims, 7 Drawing Sheets

(56) References Cited

U.S. PATENT DOCUMENTS

| | | | |
|---|---|---|---|
| 2021/0319317 A1 | 10/2021 | Power et al. | |
| 2022/0067509 A1* | 3/2022 | Qin | G06F 18/214 |
| 2022/0076095 A1* | 3/2022 | Qin | G06N 3/04 |
| 2022/0103831 A1* | 3/2022 | Li | H04N 19/172 |
| 2022/0114454 A1* | 4/2022 | Park | G11C 19/00 |
| 2022/0138282 A1* | 5/2022 | Ban | G06F 17/16 |
| | | | 708/200 |
| 2022/0164663 A1 | 5/2022 | Liu et al. | |
| 2022/0207327 A1* | 6/2022 | Kim | G06F 17/16 |
| 2022/0207356 A1* | 6/2022 | Kim | G06F 17/16 |
| 2022/0383986 A1* | 12/2022 | Popescu | G16H 30/40 |
| 2023/0305841 A1* | 9/2023 | Jain | G06N 3/065 |
| 2023/0325101 A1* | 10/2023 | Sridharan | G06F 3/0604 |

OTHER PUBLICATIONS

UKIPO Search Report dated Mar. 8, 2024 for GB Application No. GB2310908.5.

* cited by examiner

WEIGHT PROCESSING FOR A NEURAL NETWORK

BACKGROUND OF THE INVENTION

The present disclosure relates to processing data. In particular, but not exclusively, the present disclosure relates to processing and storing weights, which are suitable for use when processing neural networks using a data processing system comprising a plurality of compute resources. The present disclosure relates to methods and apparatus for processing and storing weights in conjunction with a processor, in particular but not exclusively a processor designed to implement a convolutional neural network (CNN).

DESCRIPTION OF THE RELATED TECHNOLOGY

In the context of a neural network, "weights" are parameters that are used to transform input data to produce output data. As such, for every input processed in a neural network, or layer of a neural network, there is a corresponding weight. A typical neural network will contain hundreds if not many thousands of different weight values, with each weight value needing to be retrieved and temporarily stored at different times to implement the neural network.

To implement a typical neural network, weights are retrieved when required, by a processor, from external non-transitory storage and held in memory local to the processor. To enable high read/write speeds, this local memory may often be a buffer associated with, or forming part of, the processing unit which is implementing the neural network. This buffer, or at least the part of the buffer used to store weights, may be referred to as a weight buffer. Due to the high computational cost associated with local or "on-processor" buffers, space in a weight buffer is generally limited. There therefore exists a need to more efficiently store the weights used when processing neural networks being implemented by a processor.

SUMMARY

According to a first aspect, there is provided a data processing system comprising: non-transitory memory configured to receive and store data bits defining a kernel of weights, the stored data bits being suitable for use in processing data in a neural network; and a data processing unit, configured to: receive a stream of bits, the stream of bits defining a kernel of weights for use in the neural network, wherein the kernel of weights comprises one or more non-zero value weights and one or more zero-valued weights; generate a set of mask bits, wherein a position of each bit in the set of mask bits corresponds to a position within the kernel of weights, and wherein a value of each bit in the set of mask bits indicates whether a weight in the corresponding position in the kernel of weights is a zero-valued weight or a non-zero value weight; and transmit the non-zero value weights and the set of mask bits to the non-transitory memory for storage.

According to a second aspect, there is provided a computer-implemented method comprising: receiving a stream of bits, the stream of bits defining a kernel of weights for use in a neural network, wherein the kernel of weights comprises one or more non-zero value weights and one or more zero-valued weights; generating a set of mask bits, wherein a position of each bit in the set of mask bits corresponds to a position within the kernel of weights, and wherein a value of each bit in the set of mask bits indicates whether a weight in the corresponding position in the kernel of weights is a zero-valued weight or a non-zero value; and transmitting the non-zero value weights and the set of mask bits to a non-transitory memory for storage.

According to a third aspect, there is provided an article of manufacture including a non-transitory computer-readable medium, having stored thereon program instructions that, upon execution by one or more processors disposed within a computational instance, cause the one or more processors to perform operations comprising: receiving a stream of bits, the stream of bits defining a kernel of weights for use in a neural network, wherein the kernel of weights comprises one or more non-zero value weights and one or more zero-valued weights; generating a set of mask bits, wherein a position of each bit in the set of mask bits corresponds to a position within the kernel of weights, and wherein a value of each bit in the set of mask bits indicates whether a weight in the corresponding position in the kernel of weights is a zero-valued weight or a non-zero value weight; and transmitting the non-zero value weights and the set of mask bits to a non-transitory memory for storage.

According to a fourth aspect, there is provided a computer-implemented method comprising: retrieving, from a non-transitory memory, a set of non-zero value weights and a set of mask bits, wherein a position of each bit in the set of mask bits corresponds to a position within a kernel of weights, and wherein a value of each bit in the set of mask bits indicates whether a weight in the corresponding position in the kernel of weights is a zero-valued weight or a non-zero value weight; and transmitting the set of non-zero value weights to a multiply accumulate unit, for processing with input data to form output data, wherein the set of mask bits are used to indicate the position in the kernel of weights of each non-zero value weight of the set of non-zero value weights.

BRIEF DESCRIPTION OF THE DRAWINGS

Further features and advantages will become apparent from the following description of preferred examples, given by way of example only, which is made with reference to the accompanying drawings in which like reference numerals are used to denote like features.

DETAILED DESCRIPTION OF CERTAIN INVENTIVE EMBODIMENTS

Figure 1A:
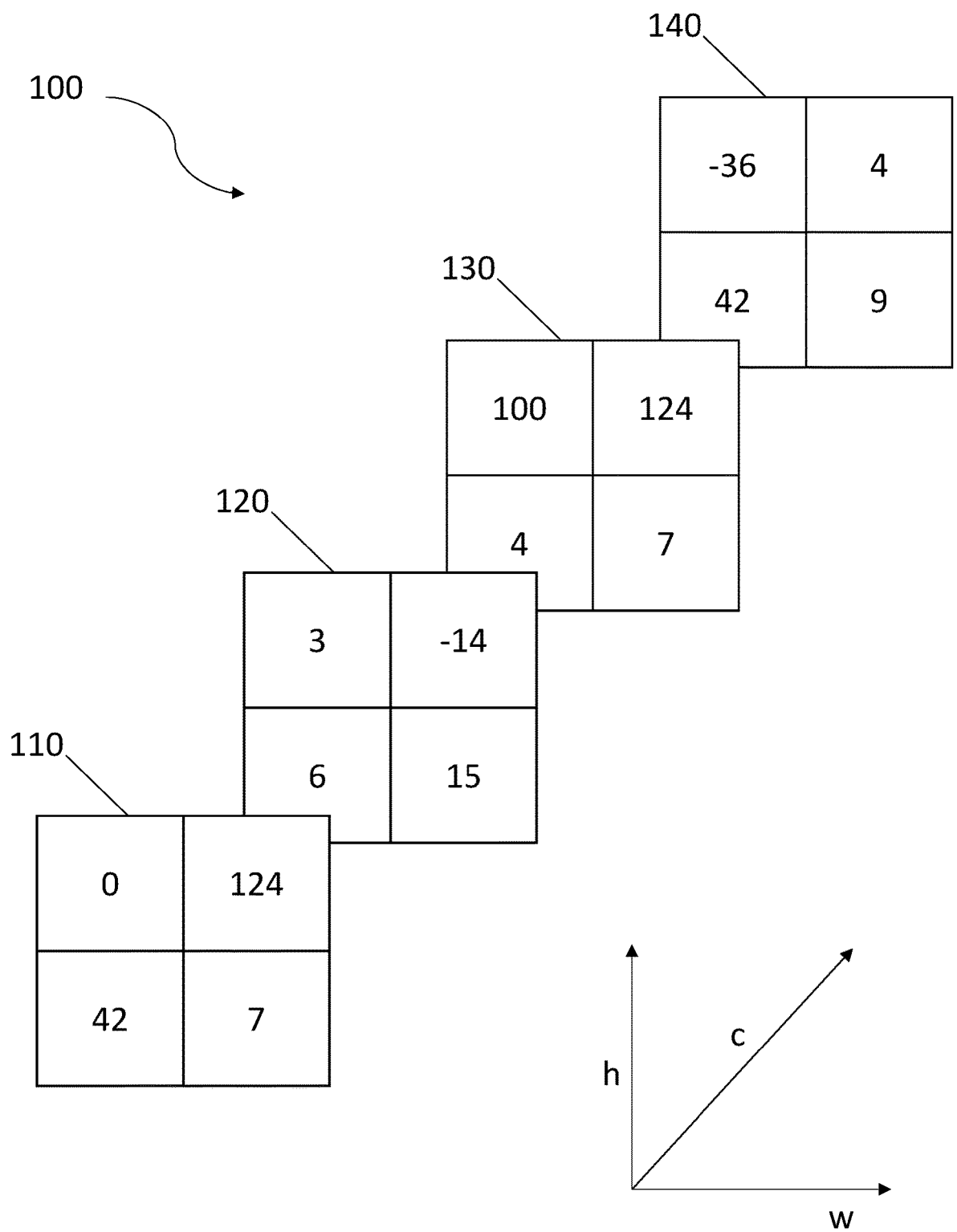
FIG. 1a is an illustration of a 2×2×4 matrix of weights.

Details of systems and methods according to examples will become apparent from the following description with reference to the figures. In this description, for the purposes of explanation, numerous specific details of certain examples are set forth. Reference in the specification to 'an example' or similar language means that a feature, structure, or characteristic described in connection with the example is included in at least that one example but not necessarily in other examples. It should be further noted that certain examples are described schematically with certain features omitted and/or necessarily simplified for the ease of explanation and understanding of the concepts underlying the examples.

A wide variety of processor types may be used to implement neural networks, such as convolutional neural networks (CNNs). These processor types include neural processing units (NPUs) and other custom processors specifically adapted for CNN computations, as well as more generalized processors adapted to perform CNN computations, including CNN-capable central processing units (CPUs), graphical processing units (GPUs), digital signal processors (DSPs), etc. Generally, these types of processors may have "on-chip" data storage, for example in the form of one or more static random-access memory (SRAM) units, dynamic random-access memory (DRAM) units, a data buffer or any other type of memory.

The types of processor that may be used in conjunction with the methods described herein are referred to herein as neurally-adapted processing unit (NAPUs). As used herein, the term "NAPU" may refer to a processor adapted to implement a CNN and may also be referred to as, or include, a neural network accelerator (NNA), a convolutional neural network accelerator (CNNA), a machine learning accelerator (MLA), or an artificial intelligence accelerator (AIA). An NAPU may include an array of specialized convolution engines (CEs), which each contain for example multiply-accumulate (MAC) hardware to perform convolutional operations.

When implementing CNNs, at least two data elements must be imported onto the NAPU. The first of these elements is the data to be processed, which may be an input feature map, defined by a multi-dimensional tensor. In the following, this data will be referred to as "input" data for simplicity. The second of the data elements is the "weights", which are parameters that are used to transform the input data to produce output data. In the following, this second data element will be referred to as "weight" data. Typically, weight data may also be defined by a multi-dimensional tensor (also known as a "filter" or a "kernel"). The multi-dimensional weight tensor generally having the same or similar dimensionality as the multi-dimensional input tensor, although generally with a smaller size. For example, one layer of a CNN may be represented by a 10×10×12 input tensor, which may be transformed into a multi-dimensional output tensor by convolving the input tensor with a 2×2×3 weight tensor, a 3×3×3 weight tensor, a 3×3×12 weight tensor, or by applying any other suitable mathematical operation.

In such data processing operations, the NAPU requires easy high-speed access to the weight data as such data generally needs to be applied to input data quickly and repeatedly in order to efficiently implement a CNN. Consequently, weight data is generally held within non-transitory memory internal to the NAPU. In some examples, this weight data may be held in a weight buffer forming part of the NAPU, or in any other suitable memory location. Such internal memory locations are generally considered to be relatively "high-cost" (as compared to, for example, off-chip system memory). It is desirable to use space in internal memory locations (such as weight buffers) as efficiently as possible. In accordance with some of the examples provided herein, it may be possible to reduce the memory size required to store a weight tensor of a given size thereby freeing up valuable internal memory for other purposes, such as storing additional weight values. Thus, more outputs may be generated from the same input data. Storing, for example, twice as many weights would allow twice as many outputs to be generated from the same input data—halving the input data traffic and power requirements. Moreover, in accordance with some of the examples provided herein, it may also be possible to store a larger weight tensor in a given memory allocation, if a more efficient manner of processing weight tensors is provided. Optimizing the storage of weight tensors may also provide processing speed improvements in situations where memory overspill occurs (which would otherwise require additional reading from external memory to solve).

The examples described herein may reduce the overall size of decompressed weight data by replacing some of the weight data with sets of mask bits, which may in turn reduce the bandwidth needed to write the decompressed weight data into internal memory and to read it back out again. For example, if on average half of the weights are zero-value weights (0's), the examples described herein may approximately reduce the number of bytes needed to be written, and thereafter read, by half (if we ignore the small amount of overhead needed for the mask bits). If the internal weight buffer can only support, for example, 32B/cycle for writes and we want to write 64 8-bit weights per cycle, we can do the writes at the needed rate with the examples of weight packing described herein. In contrast, when weight packing as described herein is not applied, it would only be possible to write half of the 8-bit weights per cycle. The size of the packed weights (the sets of weight bits and accompanying mask bits) will vary based on the number of 0 weights. However, an average rate of sparsity and packing efficiency will be reached as more weight data is decoded and processed by following the examples described herein.

Certain examples described herein relate to systems and methods for processing weight data, for storing processed weight data, and for implementing neural networks in conjunction with the stored processed weight data. These systems and methods involve identifying sets of bits, within a stream of bits, that define a kernel of weights. The kernel of weights may comprise one or more non-zero values weights and one or more zero-value weights (i.e. a value of zero). In the following, a weight having a value of zero is interchangeably referred to as a "zero-valued weight". The systems and methods may then generate a set of mask bits defining the position of each weight in the kernel and whether the weight at each position is a zero-valued weight or a non-zero value weight. The set of mask bits can be transmitted for later storage (and use) in place of one or more zero-valued weights in the kernel. The mask bits can be used either directly to indicate the position of stored non-zero value weights within the kernel or can be used indirectly to reconstruct the original kernel in conjunction with stored non-zero value weights. In this manner, a kernel of weights comprising one or more zero-valued weights may be more efficiently stored in memory, as will be explained in more detail in the following description.

FIG. 1a shows an "exploded" illustration of a 2×2×4 three-dimensional weight tensor 100. Such tensors can be defined in three-dimensions using the nomenclature "height" (h), "width" (w) and "channel" (c) (which are comparable to "x", "y" and "z" dimensions). Commonly, tensors may also be defined in four dimensions, which comprises two or more stacked three-dimensional kernels. However, for simplicity of understanding, three-dimensional weight tensors are described in the following. In the bottom right of FIG. 1a, the "h", "w" and "c" dimensions are marked. In the example shown in FIG. 1a, each weight value is represented as a numerical value. Commonly such weight values are represented by 8 bits in a bit stream, providing up to 256 possible integer values (as 2^8=256). However, any integer value range may be used, with a corresponding change in the number of bits required to represent each weight value. The set of integer values may be "symmetric", meaning they are centered around zero (i.e. providing a range of −128 to 128 in the case of an 8-bit range). Alternatively, the set of integer values may be "asymmetric", meaning they are centered around a non-zero value (for example, centered around 128 providing a range of 0 to 255). Whilst asymmetrically encoded weights may provide for more flexibility in integer range, such weights typically require at least one additional bit in order to provide an indication of the non-zero offset (i.e. the center-point of the 8-bit range), thus at least 9 bits are required to encode an 8 bit asymmetric weight value.

FIG. 1a illustrates four 2×2 tensors, respectively labelled 110, 120, 130, 140. Each 2×2 tensor comprises 4 weight values. Collectively, the four 2×2 tensors 110 to 140 form 2×2×4 three-dimensional weight tensor 100, which comprises 16 weight values. The three-dimensional weight tensor 100 may be convolved with an input feature map defining a layer of a convolutional neural network, thereby producing an output feature map. To enable this operation, three-dimensional weight tensor 100 is preferably stored in internal memory on, or in close association with, the processor that it is to perform the convolution operation. In many examples, the three-dimensional weight tensor would be stored in a weight buffer which can be directly accessed by each processing unit that requires access. If 8 bit symmetric encoding is used, the internal memory will require sufficient space to store 16 weights at 8 bits per weight (128 bits total) to store three-dimensional weight tensor 100. If 9 bit asymmetric encoding is used, this memory requirement increases to 144 bits. Moreover, in use, significantly larger weight tensors and/or wider value ranges may be employed, requiring still larger memory requirements. Consequently, it is desirable to provide systems and methods for reducing the memory requirements needed to store the weight tensors necessary to enable neural networks to be processed.

Figure 1B:
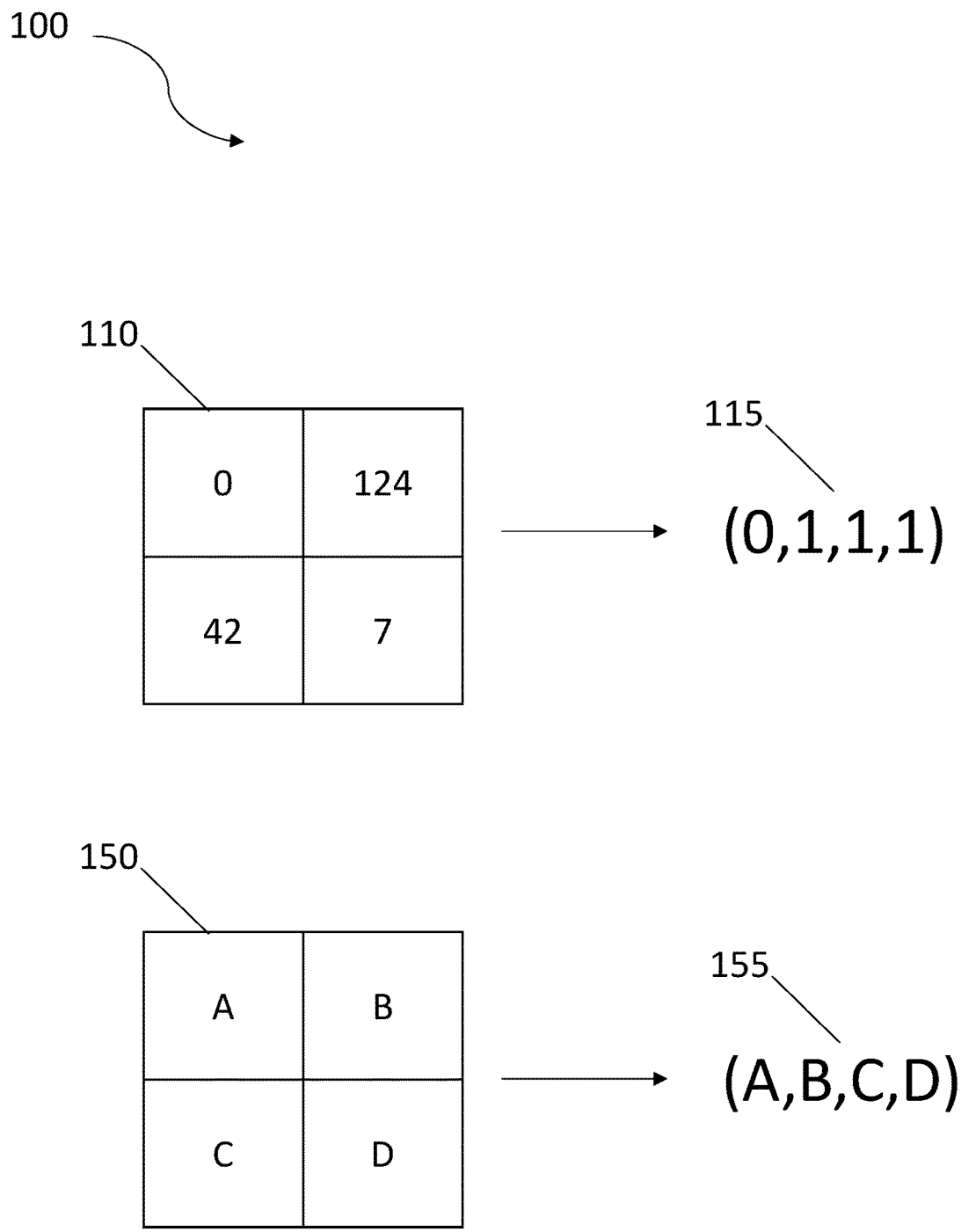
FIG. 1b is an illustration of two sets of mask bits.

FIG. 1b illustrates two sets of masks bits which are generated, in accordance with the methods described herein, to represent the position of each weight in a corresponding weight tensor (i.e. a kernel) and whether the weight at each position is a zero-valued weight or a non-zero value weight. The 2×2 tensor of weight values 110 can be used to generate a set of mask bits 115. Each bit in the set of mask bits 115 corresponds to a location in the 2×2 tensor 110. For example, the first bit of the set of mask bits 115 may correspond to the top left weight value in 2×2 tensor 110, the second bit of the set of mask bits 115 may correspond to the top right weight value in 2×2 tensor 110, the third bit of the set of mask bits 115 may correspond to the bottom left weight value in 2×2 tensor 110, and the fourth bit of the set of mask bits 115 may correspond to the bottom right weight value in 2×2 tensor 110. This positional mapping is further shown by 2×2 tensor 150 which has locations A, B, C and D, and a corresponding set of mask bits 155 showing corresponding position locations in the set of mask bits 155, A, B, C and D. Any other order of mapping of mask bit values to weight value may be used. For example, in a three dimensional weight tensor, the set of mask bits may correspond to locations in the z or c direction for a particular x,y (h,w) position (i.e. a first set of mask bits may define the "top left position" in each x,y slice through the z dimension, and a second set of mask bits may define the "top right position" in each x,y slice through the z dimension). For different tensor sizes, a different number of mask bits may be required. For example, for a 3×3 tensor, a set of 9 mask bits may be required.

The value of each bit (i.e. whether it is a 1 or a 0) in the set of mask bits may represent whether the corresponding weight value is a zero-valued weight or a non-zero value weight. For example, a 0-value mask bit may indicate that the corresponding weight value is a zero-valued weight, and a 1-value mask bit may indicate that the corresponding weight value is a non-zero value weight. Thus, set of mask bits 115, (0,1,1,1), may indicate that the top left value in the corresponding 2×2 tensor 110 is a zero-value weight, whilst every other value in the 2×2 tensor 110 is a non-zero value weight.

Figure 2:
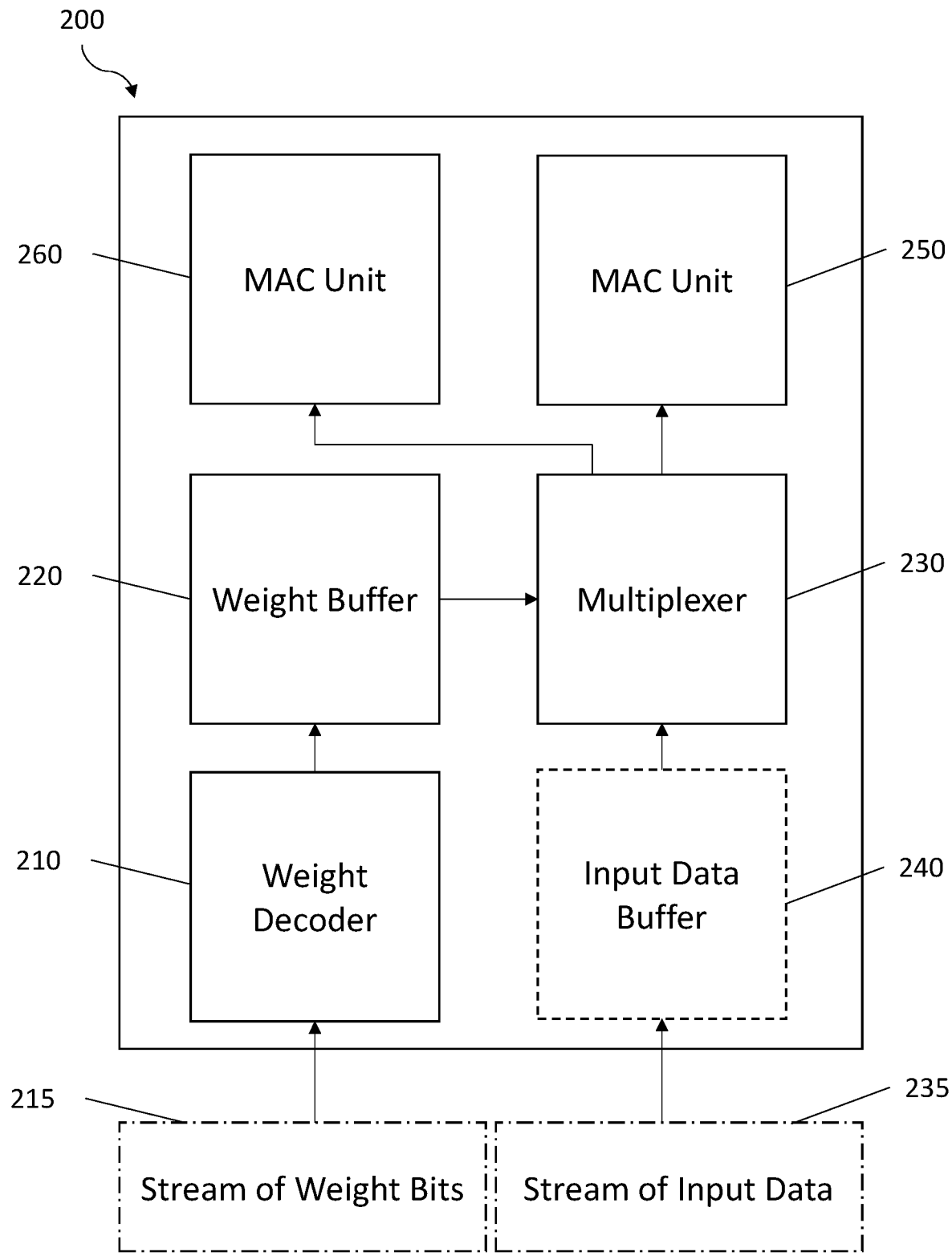
FIG. 2 shows schematically a computing system configured to perform data processing operations.

FIG. 2 illustrates an example of a computing system 200 which may be used to receive, modify and thereafter process such weight tensors. In the following description, elements of the computing system are described separately to aid understanding. In other examples, one or more of the described elements may be combined into a single hardware element. In some examples, data processing system 200 may form a neurally-adapted processing unit (NAPU) which is, or includes, a specialized integrated circuit specifically designed for processing data in accordance with neural network architectures, for example convolutional neural network (CNN) architectures.

Computing system 200 comprises a weight decoder 210. Weight decoder 210 is configured to receive a stream of weight bits 215 from an external source. The stream of weight bits comprises sets of bits defining weight values of one or more weight tensors (for example sets of 8 bits for 8 bit encoded weights). The stream of weight bits will be described in more detail in later parts of the description. For now, it is sufficient to understand that the weight decoder is configured to receive the stream of weight bits 215 and identify one or more sets (groups) of bits, within the stream of bits, that define weight values within a weight tensor.

Computing system 200 further comprises a weight buffer 220 which is in data communication with weight decoder 210. Weight buffer may be implemented in any suitable form of memory hardware, such as non-volatile memory (for example, dynamic random-access memory (DRAM) or synchronous dynamic random-access memory (SDRAM)), or non-volatile memory (such as flash memory, a solid-state drive (SSD) or non-volatile random-access memory (NVRAM)). Weight buffer 220 is configured to receive and store data from the weight decoder. The data received from the weight buffer comprises sets of bits, that define weight values, identified by the weight buffer. Dependent on the requirements of the computing system 200, the size of available memory in the weight buffer 220, and the requirements of a neural network being processed by the computing system 200, the weight buffer may be configured to store sufficient sets of bits to define a complete weight tensor, a partial weight tensor, or even multiple weight tensors.

Computing system 200 further comprises a multiplexer 230. Multiplexer 230 is in data communication with weight buffer 220 and is configured to retrieve sets of bits, which define weight values of a weight tensor, as and when required. Multiplexer 230 is further configured to receive a stream of input data 235 from an external source. Input data stream 235 is illustrated in FIG. 2 as a separate data stream from weight bit stream 215 to aid clarity. However, in further examples, the input data stream 235 and the weight bit stream 215 may be carried in a single stream. The input data stream carries input data for processing by the computing system, in order to produce output data. The input data may define one or more layers of a neural network for performing convolutional computations. In other words, the input data may comprise sets of bits which define input feature maps (IFMs), which when processed with a suitable weight tensor, may be transformed to output feature maps (OFMs).

In some examples, computing system 200 may further comprise an input data buffer 240, which receives data from the stream of input data 235. The input data buffer 240 is also in data communication with multiplexer 230. The input data buffer 240 may be implemented in any suitable form of memory hardware, such as non-volatile memory (for example, dynamic random-access memory (DRAM) or synchronous dynamic random-access memory (SDRAM)), or non-volatile memory (such as flash memory, a solid-state drive (SSD) or non-volatile random-access memory (NVRAM)). Input data buffer 240 is configured to receive and store data from the stream of input data 240, in order to either assemble partial or complete input feature maps, and/or as a holding location until the input data is required by the multiplexer 230. The input data stored in the input data buffer comprises sets of bits, that define inputs, input tensors, input feature maps, and/or partial input feature maps for use in implementing a neural network. Dependent on the requirements of the computing system 200, the size of available memory in the input data buffer 240, and the requirements of a neural network being processed by the computing system 200, the input data buffer may be configured to store sufficient sets of bits to define a complete input feature map, a partial input feature map, or even multiple input feature maps. In some examples, the input data buffer 240 and the weight buffer 220 may be a single memory unit of the computing system 200. In still further example, one or more of the input data buffer 240 and the weight buffer 220 may be absent and the corresponding data stream instead processed in real-time, without buffering, in accordance with the methods described herein.

Computing system 200 further comprises at least one multiply accumulate (MAC) unit. In FIG. 2, two such MAC units 250, 260 are illustrated. Each MAC unit 250, 260 is configured to receive, from the multiplexer 230, both weight data defining one or more weights of a weight tensor, and input data defining an input to be processed by the one or more weights to produce an output. The output from the MAC unit may be stored in internal memory of the computing system 200 (not shown), transmitted off the computing system 200 for further processing, or fed back into one or both of the weight buffer 220 and input data buffer 240 for use in further calculation(s) being performed by the computing system 200.

In the example shown in FIG. 2, two MAC units 250 and 260 are shown. However, in further examples, a single MAC unit may be present, or additional MAC units may be present. A computing system with a single MAC unit may be cheaper to produce. However, it may be correspondingly slower at performing certain computational tasks. Multiple MAC units may enable some calculations to be parallelized, and thus two or more MAC units may be preferable in any given computing system 200. Where more than two MAC units are present, additional multiplexers, decoders and buffers (not shown) may be provided in order to efficiently supply each MAC unit with the data it needs to perform its calculations.

The computing system 200 may further include post-compute resources (not shown) which are arranged to perform additional processing operations on data being output from each MAC unit 250, 260. The operations may include, for example, pooling operations and applying activation functions. The post-compute resources may be programmed to perform different operations for different layers within a given neural network, allowing for a broad range of neural network architectures to be implemented by the computing system 200.

Figure 3:
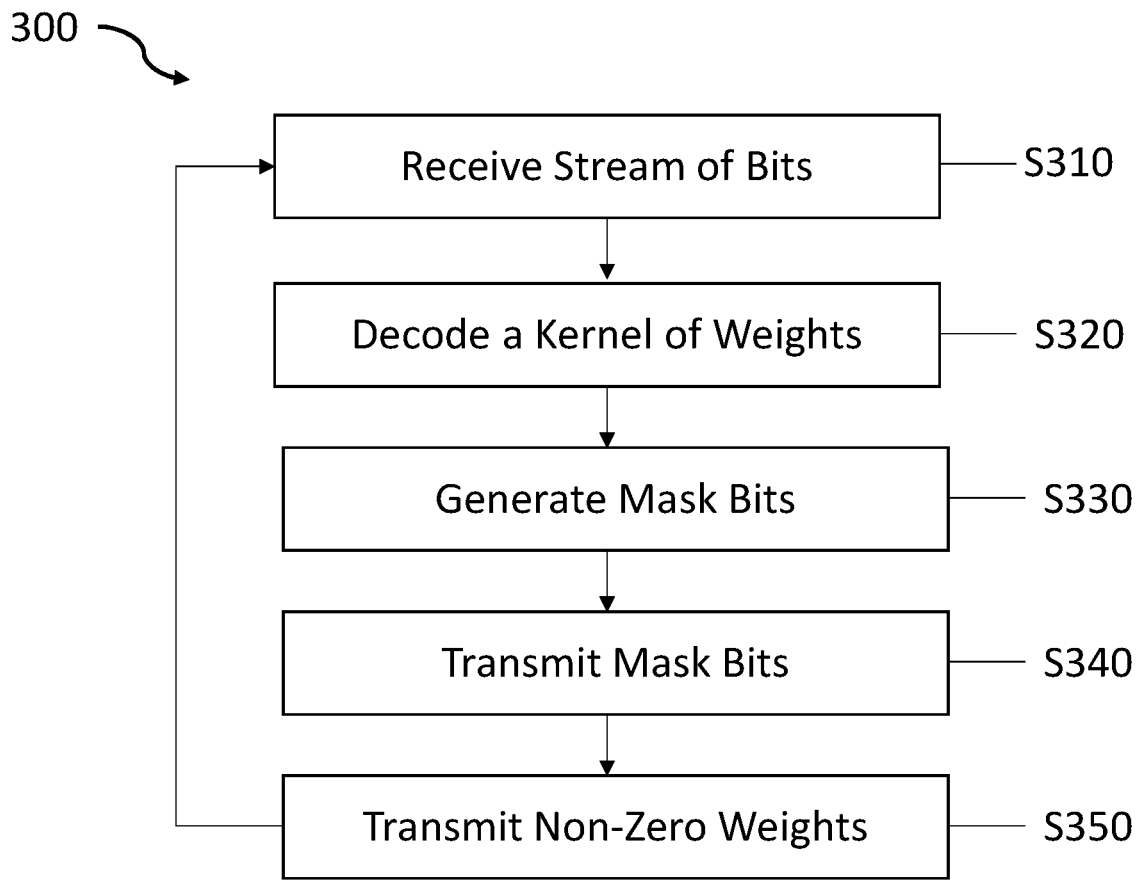
FIG. 3 is a flow chart illustrating a method for processing data.

FIG. 3 illustrates a method 300 of processing a stream of weight bits 215 by a weight decoder 210, such as that illustrated in FIG. 2. At step S310, a stream of bits is received. This stream of bits comprises bits which define one or more weights of a weight tensor, these bits will be referred to as weight bits. Once received, or as the stream is being received, the stream of weight bits is decoded at step S320 in order to detect/identify each weight value in the weight tensor. Any known method of decoding/detecting/identifying sets of bits that correspond to weight values may be used.

At step S330, a set of mask bits is generated for the decoded weight tensor. As described previously in connection with FIG. 1*b*, the set of mask bits indicates the position of each weight in the kernel and whether the weight at each position is a zero-valued weight or a non-zero value weight.

Once a set of mask bits has been generated at step S330, at step S340 the set of mask bits is transmitted on for storage in internal memory, such as the weight buffer, and/or for further use by other elements of the processing system. The set of mask bits are transmitted in place of the one or more bits which defined the zero-valued weights in the weight tensor (kernel), the bits defining the zero-valued weights may optionally being discarded at this point. At step S350, the non-zero value weights of the tensor of weights may also be transmitted on for storage in internal memory, such as the weight buffer, and/or for further use by other elements of the processing system. The non-zero value weights may be transmitted with the set of mask bits, or separately. The non-zero value weights may be transmitted for storage in the same memory location as the set of mask bits or in a different memory location.

Following the transmission of the set of mask bits and the set of non-zero weights, the method returns to step S310 and a further set of bits is identified in the stream of bits. The method of FIG. 3 may run repeatedly until the entire stream of bits has been processed, at which point the method ends until a further stream of bits is received.

Advantageously, the set(s) of mask bits that are generated at step S350 may comprise fewer bits that the set of bits defining a zero-valued weight they replace. The processes described herein may enable a level of compression of the decoded bitstream, compressing the size of the data used for further processing. This method of sending on only non-zero weight values and a set of mask bits may be referred to as a form of "weight packing", which can reduce the bandwidth needed to write weights to the buffer and read them out of the buffer again later, and may also increase the number of weight values which can be stored in a fixed sized weight buffer. In some examples, two weight buffers may be present in the hardware used to implement the methods described herein. The first weight buffer may be static random-access memory (SRAM) which is written into by the weight decoder, and is where weights may be kept in a packed format. The second weight buffer may be a smaller memory that is loaded from the SRAM weight buffer when the weights are used for multiply-accumulate (MAC) operations. Alternatively, in some examples, a single weight buffer may be used. Typically, when two weight buffers are present, the weights are unpacked in the second buffer. However, in certain examples (for example, where sparse weight encoding has been applied), the mask bits and packed weight values may be written into the second buffer (without unpacking) and the mask bits used to control the multiplexer(s) that direct the input data values to the MAC inputs. However, in still further examples (such as when asymmetric weight encoding is employed and the second weight buffer is limited in size) it may be preferable to not implement the methods described herein as too many bits per weight may be required in the second weight buffer. Nevertheless, in many operating modes, implementing the method of FIG. 3 can reduce the memory storage requirements needed to store a weight tensor comprising one or more zero-valued weights, by reducing the total number of bits needed to define the weight tensor.

Returning to steps S340 and S350, the sets of mask bits and non-zero weights may be sent to a weight buffer, such as an SRAM. Subsequent to this, the mask bits and non-zero weights may be used to enable a multiplexer to process input data to produce output data. In a first example, the mask bits and non-zero weights may be used to reconstruct the original kernel of weights (which may referred to as weight unpacking), and the original kernel of weights may be used by the multiplexer to process input data to produce output data. The original kernel of weights may be reconstructed by using the position and value of each bit in the set of mask bits to indicate where in the reconstructed kernel of weights to place a corresponding non-zero value weight and where to place a zero-valued weight. In a second example, the original kernel need not be reconstructed. Instead, the mask bits may be used to indicate to the multiplexer the location of the non-zero value weights within the original kernel of weights and/or identify a subset of input data to process with the non-zero value weights (using mask bits indicative of a zero-value weight to identify parts of the input data that need not be processed—as processing input data in a MAC unit with a zero-value weight will produce a zero-value output).

The above described methods reduce the number of bits required to define a weight tensor. However, given the additional computational burden needed to produce the set(s) of mask bits, it may not always be preferable to implement the generation of mask bits. In further examples, the method may further comprise determining a type of encoding applied to weight bits in a stream of weights. The type of encoding applied to weight bits in a stream of weights may be identified in any known manner, such as through analysis of the weight bits themselves or through the detection of encoding bits within the stream of bits which are indicative of an applied encoding type. In some examples, the methods described herein may only be implemented when asymmetric encoding of weights is detected (by for example detection of offset bits in the weight stream).

Additionally, or alternatively, the methods described herein may only be implemented when the bit range defining the weights is greater than a predetermined threshold. The predetermined threshold may define a minimum bit encoding. Since sets of mask bits will require a certain number of bits to indicate the positions of the weights in a weight tensor, the predetermined threshold may be equal to, or greater than, the number of mask bits required to define the weight tensor. For example if, for a particular weight tensor, 6 mask bits are required, the methods described herein may only be implemented when weights in the weight tensor are defined in the bit stream by 6 or more bits (or a greater number of bits). Alternatively, the predetermined threshold may be set to a set bit range, such a 4, 5, 6, 7, 8, 9, 10, 11 or 12 bit encoding. The number of bits defining each weight in the weight tensor and each set of mask bits can be simply determined, by, for example, counting the number of bits defining weights in the weight stream. This can then be compared to the size of a weight tensor and/or the predetermined threshold. Such a predetermined threshold may ensure that sets of mask bits require less space in memory than the weight bits they replace.

Additionally, or alternatively, the methods described herein may only be implemented when a sparsity threshold is equaled or passed. In this context, sparsity is the relative number of zero-valued weights to non-zero value weights in the weight data that is being processed, or has been processed, in accordance with the examples described herein. Thus, sparsity may provide a relative measure (or percentage) of zero-valued weights to non-zero value weights. When this percentage is low (for example less than 10%, less that 20%, less than 30%, less than 40%, less than 50% or less than 60%), the overhead of introducing an extra mask bit per weight may not be desirable and thus mask bit generation and weight packing may be stopped. In other words, the examples described herein may only be implemented when the weight sparsity is equal to, or greater than, a predetermined sparsity threshold.

The reduction in bandwidth needed to write weights to memory and thereafter read the weights from memory (and in some examples the reduction in memory capacity needed to store a weight tensor) provided by the methods described herein may scale with the number of zero-valued weights in the weight tensor. It may therefore be advantageous to implement these methods when certain weight encoding schemes are detected. For example, in some neural networks, weight tensors are "sparse weight encoded", in which (depending on the type of sparse weight encoding) a number of weights in the weight tensor are deliberately reduced to zero. There are a number of reasons as to why sparse weight encoding may be employed (for example it has been found in many cases that sparse weight encoding can be applied to neural networks without significantly degrading their function). However, for the following it is only necessary to understand that encoding schemes like sparse weight encoding exist and that the presently described methods may be applied to weight tensors encoded in this manner.

Figure 4:
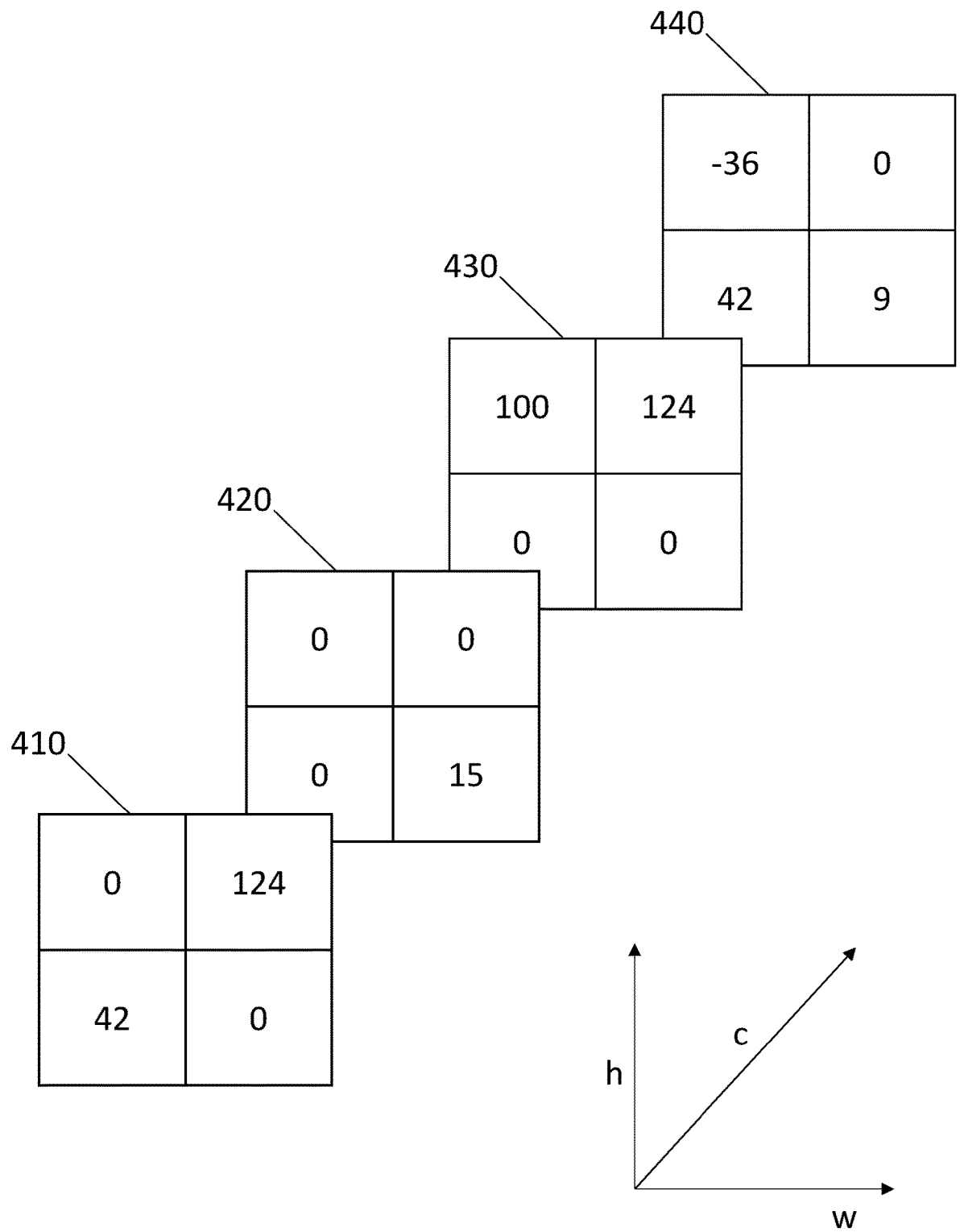
FIG. 4 an illustration of a 2×2×4 matrix of weights following ¾ sparse weight encoding.

FIG. 4 illustrates the 2×2×4 weight tensor of FIG. 1a, having had sparse weight encoding applied to it. In this case, ⅔ sparse weight encoding has been applied. In ⅔ sparse weight encoding, 2 out of every 4 weights in the channel "c" direction are reduced to zero (i.e. they are zeroed). In sparse weight encoding, it is the weight values which are closest to zero (or already zero) that are set to zero. Hence, in FIG. 4, for the top left "channel" (comprising the top left value of each of 2×2 matrices 410 to 440), it is the weight values of 2×2 matrices 410 and 420 that have been set to zero. For the top right channel, it is the weight value of 2×2 matrices 420 and 440 that have been set to zero. For the bottom left channel, it is the weight value of 2×2 matrices 420 and 430 that have been set to zero. For the bottom right channel, it is the weight value of 2×2 matrices 410 and 430 that have been set to zero.

The application of ⅔ sparse weight encoding to the weight tensor of FIG. 1a has increased the number of zero-valued weights in the weight tensor from one to eight. Hence, if the methods described herein are applied to the weight tensor of FIG. 4, 8 values in the set of mask bits would be "zero" and 8 values in the sets of mask bits would be "one". The more weight values reduced to zero by sparse weight encoding the greater the compression effect of the methods described herein will be, and the greater number of non-zero weight values that can be "packed" into the subsequent weight buffers. In examples where a known level of sparsity is present in the received weight data (i.e. where ⅔ sparse weight encoding, or any other form of sparse weight encoding, has been determined) it is possible to reliably allocate less storage in memory for the packed weights, as a consistent reduction in memory size per set of weight bits may be obtained. In this case, two benefits may be achieved, 1) reduced bandwidth requirements for the decoded weights, and 2) an effectively higher capacity of the internal buffer. Thus, the methods described herein may be particularly advantageous when applied to sparse weight encoded weight tensors.

FIG. 4 illustrates ⅔ sparse weight encoding. However, the methods described herein may be applied to any other type of sparse weight encoding, such as ¼ sparse weight encoding (where 1 out of every 4 weights is zero-valued), ⅓ sparse weight encoding (where 1 out of every 3 weights is zero-valued), ⅖ (where 2 out of every 5 weights is zero-valued) and so forth.

In some examples, the methods described herein may only be applied to sparse weight encoded weight tensors. To enable this, the methods described herein may be adapted to include a further step of determining the type of encoding applied to a weight tensor, by analyzing a received weight bit stream and/or analyzing the sets of bits determined to represent weights of a weight tensor, and/or any other suitable method of determining the encoding type.

Figure 5:
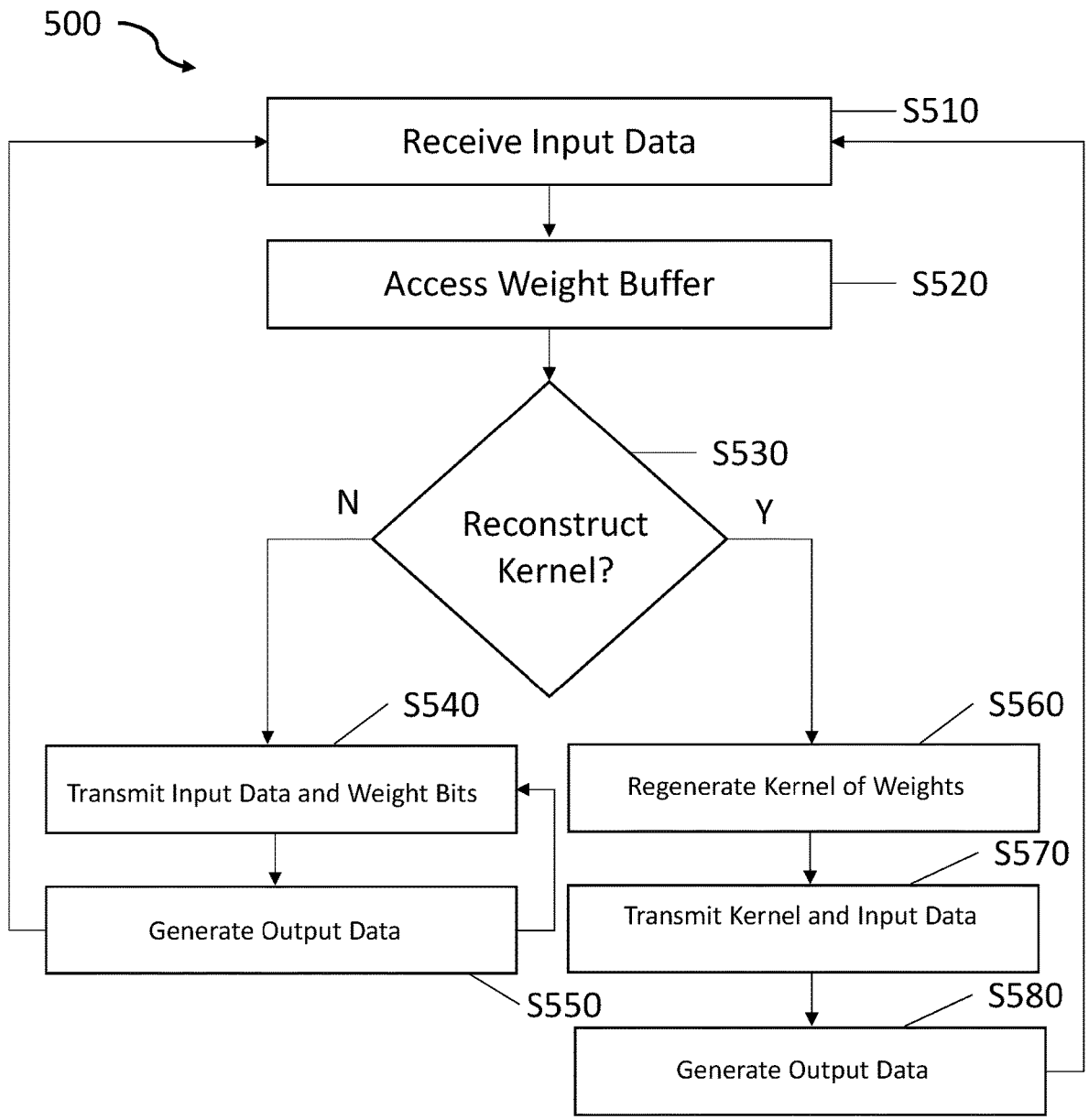
FIG. 5 is a flow chart illustrating a method for processing data.

FIG. 5 illustrates a method 500 of processing a neural network. The method of FIG. 5 may be used to process input data, such as an input feature map of a convolutional neural network, with a multi-dimensional tensor of weights which has been processed in accordance with one or more of the methods described herein, in order to produce an output feature map. This processing step may comprise a convolution operation, wherein a multi-dimensional tensor of weights is convolved with an input feature map to produce an output feature map.

At step S510, input data is received. The input data comprises a stream of input bits which defines an input feature map, or part of an input feature map, of a neural network. The input data may define a multi-dimensional input tensor, or any other suitable data structure.

At step S520, based on or in response to the receipt of input data at step S510, one or more weight buffers is accessed in order to access and read sets of bits, stored in the weight buffer(s), wherein the sets of bits define one or more weights with which to process the input data. As described previously, the sets of bits may define all or part of a multi-dimensional weight tensor, which when used to process input data, can produce output data. Following the methods described previously, the weight buffer may only be storing bits defining non-zero weight values. The weight buffer accessed at step S520 also comprises one or more sets of mask bits, which may have been produced by any of the methods described herein. Accessing the weight buffer at step S520 may comprise retrieving multiple sets of bits defining an entire kernel of weights, or a limited number of sets of bits defining part of a kernel of weights.

At step S530, a determination may be made as to whether it is necessary to reconstruct the original weight tensor (kernel of weights). The determination may be made based on the type of encoding used (sparse weight encoding or not), based on whether there is an expected number of zero weight values in the weight tensor, or if necessary for any other reason.

If at step S530 it is not necessary to reconstruct the original kernel of weights, one or more sets of mask bits and one or more weight values may be retrieved from the weight buffer and transmitted for processing with the input data at step S540. Each set of mask bits may be used, once or repeatedly (for example where the kernel needs to be applied repeatedly to an input feature map to produce an output feature map), to indicate the positions of the weights within a weight kernel. Each set of mask bits may be used to indicate a value (or values when applied repeatedly) within the input data which corresponds to a zero-value weight in the weight kernel, which can be ignored during processing of the input data (as multiplying a value in the input data with a zero-valued weight would result in a zero value, which may therefore makes processing of the input data value redundant). Thus, the mask bits may be used to identify a subset of the input data to use in conjunction with the non-zero weight values in order to obtain output data at step S550. Alternatively, or in addition, the mask bits may be used to provide an indication of a zero value and a position of said zero value, which may be transmitted to storage (bypassing any MAC unit processing) to form part of an output feature map. Hence, at steps S540 and S550, each set of mask bits may be used to indicate input data bits to ignore/prevent further MAC processing from occurring on, until the received input data has been processed, and/or until the mask bits are otherwise indicated as redundant (by for example new weight bits being stored in the weight buffer). Once the sets of mask bits are no longer required, the method may return to step S510, where new input data (and new sets of weight bits) may be received and processed in accordance with the methods described herein.

Returning back to step S530, if it is necessary to reconstruct the original kernel of weights, one or more sets of mask bits and one or more non-zero weight values may be retrieved from the weight buffer and used to re-generate the original kernel of weights (tensor) at step S560. The original kernel can be reconstructed by using the one or more sets of mask bits to indicate the position and location of each zero and non-zero value weight in the kernel, and the values of each non-zero weight are known as they were stored in the weight buffer.

Once the original kernel has been regenerated at step S560, the regenerated kernel of weights may be transmitted with the input data for processing at step S570, to produce output data. The kernel of weights and input data may be processed together using any known method. For examples, sets of input bits and correspond weight bits (from the kernel of weights) may be sent to a multiply-accumulate (MAC) unit for processing together to produce output data at step S580. The sets of input bits and weight bits sent to the MAC unit may be selected and transmitted by a multiplexer (as described previously). The output data produced by the MAC unit may then be stored and/or transmitted for use by other elements of a processing system. This process may then repeat with further sets of input bits and corresponding sets of weight bits being sent to the MAC unit at step S570 for processing to produce output data at step S580, until the all of the received input data is processed (i.e. an entire input feature map has been processed) or until a stop command is received or other action occurs which stops further processing. After step S580, the method may return to step S510, where new input data (and new sets of weight bits) may be received and processed in accordance with the methods described herein.

As set out above, the use of sets of mask bits may reduce the size of the memory required to store a weight tensor. In addition, as sets of mask bits may reduce the processing steps required to be performed to process input data to form output data, the processing requirements to process a particular neural network may be reduced by employing the methods described herein. Similarly, for a given processor capacity, the speed of processing a particular neural network may be increased, as fewer MAC operations may need to be performed. These advantages scale with the number of zero-valued weights in the weight tensor to be applied to the input data. Therefore, it may be particularly advantageous to implement these methods when certain weight encoding schemes are detected. For example, where weight tensors are "sparse weight encoded" (as described previously).

The methods described herein may equally be applied to processing systems having more than one MAC units, with the required operations being split across each MAC unit in a parallelized manner. Increasing the number of MAC units in a given processing system may increase the processing speed for processing a particular set of input data, at the cost of additional system costs.

Figure 6:
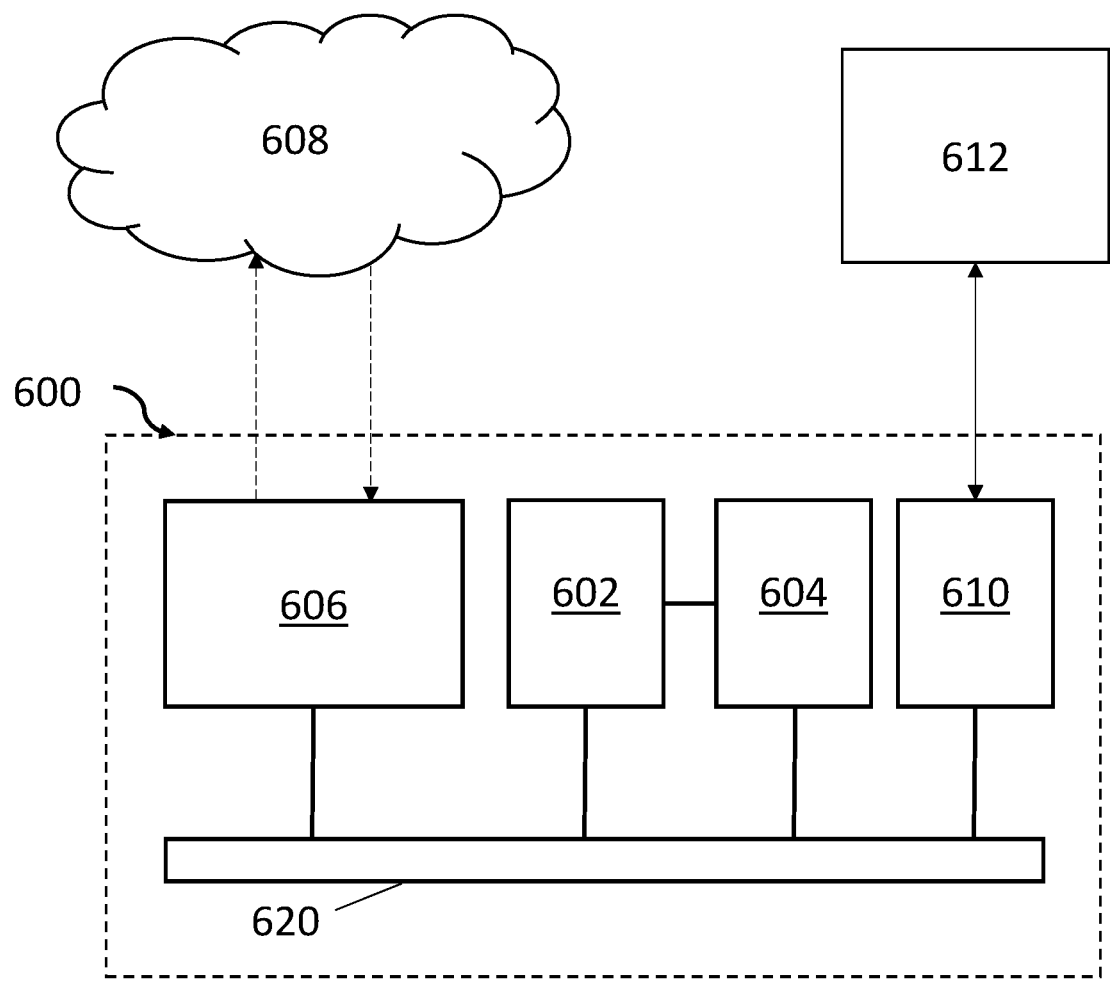
FIG. 6 shows schematically a computing system configured to perform data processing operations.

In the above examples, the methods described herein have been described in relation to their implementation on the processing system illustrated in FIG. 2. In further embodiments, the methods described herein for processing data may be implemented on any suitable computing device. FIG. 6 illustrates internal components of an alternative computing device 600 for use with the methods described herein. The computing device 600 may include storage 602 which may include one or more volatile memory, such as a Random Access Memory (RAM) and non-volatile memory, such as Read Only Memory (ROM) or a solid state drive (SSD) such as Flash memory. The storage 602 may include other storage devices, such as, for example, magnetic or optical, and may be in a format such as compact disc (CD), digital versatile disc (DVD) or other storage media. The storage 602 may be removable, such as SD or USB type drives or non-removable from the computing device 600. Storage 602 may be used to store any of the data elements described herein, including input data, weight bits, mask bits and output data.

The computing device 600 may include at least one processor 604 that is communicatively coupled to the storage 602. The at least one processor 604 may include a microprocessor, a general-purpose processor, an application specific integrated circuit (ASIC), a digital signal processor (DSP), a field programmable gate array (FPGA) or other programmable logic device, discrete hardware components, a discrete gate or transistor logic, or any suitable combination thereof capable of performing the functions described herein. A processor may also be implemented as a combination of computing devices, such as, for example, a plurality of processors, a combination of a DSP and a microprocessor, one or more microprocessors in conjunction with a DSP core, or other such configuration.

Computing device 600 also includes a network interface 606 which can be communicatively connected to a network 608 to receive data, such as input data and weight data. The network 608 may be the Internet, a local Intranet, a local or remote data server, a link to another local or remote computing device. The network interface 606 may connect to, and receive data via, any known wired or wireless data transfer technology. The computing device 600 can accumulate data from the network 608 into a dataset in the storage 602.

Storage 602 in the example of FIG. 6 includes computer program instructions configured to, when processed by at least one processor 604, implement a method for processing data, in accordance with any of the example methods described herein. The computer program instructions and data may be stored in an accessible non-transitory computer-readable medium and loaded into memory, for example storage 602.

The computing device 600 may also include an interface 610 for a user interface 612. The interface 610 and user interface 612 may in conjunction provide a user with the ability to interact with the computing device 600 to input commands, data, and/or other information. The components of the computing device 600 are interconnected using a system bus 620. This allows data to be transferred between the various components of the computing device 600.

The above embodiments are to be understood as illustrative examples of the present disclosure. Further embodiments are envisaged. It is to be understood that any feature described in relation to any one embodiment may be used alone, or in combination with other features described, and may also be used in combination with one or more features of any other of the embodiments, or any combination of any other of the embodiments. Furthermore, equivalents and modifications not described above may also be employed without departing from the scope of embodiments, which is defined in the accompanying claims.

What is claimed is:

1. A data processing system comprising:
   non-transitory memory configured to receive and store data bits defining a kernel of weights, the stored data bits being suitable for use in processing data in a neural network; and
   a data processing unit, configured to:
      receive a stream of bits, the stream of bits defining a kernel of weights for use in the neural network, wherein the kernel of weights comprises one or more non-zero value weights and one or more zero-valued weights;
      generate a set of mask bits, wherein a position of each bit in the set of mask bits corresponds to a position within the kernel of weights, and wherein a value of each bit in the set of mask bits indicates whether a weight in the corresponding position in the kernel of weights is a zero-valued weight or a non-zero value weight; and
      transmit the non-zero value weights and the set of mask bits to the non-transitory memory for storage.

2. The data processing system of claim 1, wherein the stream of bits further comprises encoding bits, the encoding bits being indicative of a type of encoding applied to the stream of bits, and wherein the data processing unit is further configured to:
   check the stream of bits for encoding bits; and
   generate the set of mask bits when the encoding bits indicate sparse-weight encoding has been applied to the stream of bits.

3. The data processing system of claim 1, wherein the data processing system is a neurally-adapted processing unit, wherein the non-transitory memory is a weight buffer, and wherein the data processing unit is a weight decoder.

4. The data processing system of claim 1, wherein the set of mask bits comprises fewer bits than the number of bits in the stream of bits used to define the one or more non-zero value weights in the kernel of weights.

5. The data processing system of claim 1, further comprising:
   a multiplexer configured to:
      receive a stream of input data;
      access the non-zero value weights and the set of mask bits stored in the non-transitory memory; and transmit the non-zero value weights and a subset of the input data to a multiply-accumulate unit for processing, wherein the subset of input data sent to the multiply-accumulate unit is selected by the multiplexer based on an indication of the position of the non-zero value weights within the kernel of weights, the indication being determined from the set of mask bits; and a multiply-accumulate unit configured to receive and process the non-zero value weights and the subset of the input data to form output data.

6. The data processing system of claim 5, wherein the input data defines an input feature map and wherein the output data defines an output feature map.

7. The data processing system of claim 1, further comprising:
a multiplexer configured to:
receive a stream of input data;
access the non-zero value weights and the set of mask bits stored in the non-transitory memory;
re-generate the kernel of weights based on the non-zero value weights and the set of mask bits; and
transmit the non-zero value weights and a subset of the input data to a multiply-accumulate unit for processing, wherein the subset of input data sent to the multiply-accumulate unit is selected by the multiplexer based on the re-generated kernel of weights; and
a multiply-accumulate unit configured to receive and process the non-zero value weights and the subset of the input data to form output data.

8. The data processing system of claim 1, wherein the received stream of bits defines a ⅔₄ sparse weight encoded kernel of weights, in which two out of every four weights in the depth dimension are zero-valued weights.

9. The data processing system of claim 1, wherein the received stream of bits defines a kernel comprising symmetrically encoded weights.

10. A computer-implemented method comprising:
receiving a stream of bits, the stream of bits defining a kernel of weights for use in a neural network, wherein the kernel of weights comprises one or more non-zero value weights and one or more zero-valued weights;
generating a set of mask bits, wherein a position of each bit in the set of mask bits corresponds to a position within the kernel of weights, and wherein a value of each bit in the set of mask bits indicates whether a weight in the corresponding position in the kernel of weights is a zero-valued weight or a non-zero value weight; and
transmitting the non-zero value weights and the set of mask bits to a non-transitory memory for storage.

11. The computer-implemented method of claim 10, wherein the stream of bits further comprises encoding bits, the encoding bits being indicative of a type of encoding applied to the stream of bits, and wherein the method further comprises:
checking the stream of bits for encoding bits; and
generating the set of mask bits when the encoding bits indicate sparse-weight encoding has been applied to the stream of bits.

12. The computer-implemented method of claim 10, further comprising:
analyzing the stream of bits to determine an encoding type applied to the stream of bits; and
generating the set of mask bits when it is determined that sparse-weight encoding has been applied to the stream of bits.

13. The computer-implemented method of claim 10, wherein the set of mask bits comprises fewer bits than the number of bits in the stream used to define the one or more non-zero value weights in the kernel of weights.

14. The computer-implemented method of claim 10, further comprising:
receiving a stream of input data;
accessing the non-zero value weights and the set of mask bits stored in the non-transitory memory;
transmitting the non-zero value weights and a subset of the input data to a multiply-accumulate unit for processing, wherein the subset of input data sent to the multiply-accumulate unit is selected based on an indication of the position of the non-zero value weights within the kernel of weights, the indication being determined from the set of mask bits; and
processing, by the multiply accumulate unit, the non-zero value weights and the subset of the input data to form output data.

15. The computer-implemented method of claim 14, wherein the input data defines an input feature map and wherein the output data defines an output feature map.

16. The computer-implemented method of claim 10, wherein the received stream of bits defines a ⅔₄ sparse weight encoded kernel of weights, in which two out of every four weights in the depth dimension are zero-valued weights.

17. The computer-implemented method of claim 10, wherein the received stream of bits defines a kernel comprising symmetrically encoded weights.

18. A computer-implemented method comprising:
retrieving, from a non-transitory memory, a set of non-zero value weights and a set of mask bits, wherein a position of each bit in the set of mask bits corresponds to a position within a kernel of weights, and wherein a value of each bit in the set of mask bits indicates whether a weight in the corresponding position in the kernel of weights is a zero-valued weight or a non-zero value weight; and
transmitting the set of non-zero value weights to a multiply accumulate unit, for processing with input data to form output data,
wherein the set of mask bits are used to indicate the position in the kernel of weights of each non-zero value weight of the set of non-zero value weights.

19. The computer-implemented method of claim 18, further comprising:
reconstructing, before transmitting the set of non-zero value weights, the kernel of weights,
wherein the kernel of weights is reconstructed based on the non-zero value weights, the position of each bit in the set of mask bits, and the value of each bit in the set of mask bits, and
wherein transmitting the set of non-zero value weights comprises transmitting the reconstructed kernel of weights.

20. The computer-implemented method of claim 18, further comprising:
using the set of mask bits to control the multiply-accumulate unit.

* * * * *